(12) United States Patent
Rupp et al.

(10) Patent No.: US 6,445,230 B1
(45) Date of Patent: Sep. 3, 2002

(54) PROGRAMMABLE DIGITAL PHASE LOCK LOOP

(75) Inventors: Michael E. Rupp, Amherst; Ronald D. Olsen, Lake View, both of NY (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/750,671

(22) Filed: Dec. 29, 2000

(51) Int. Cl.[7] .................................................. H03L 7/00
(52) U.S. Cl. ........................................ 327/151; 327/156
(58) Field of Search ................................. 327/151, 156, 327/159, 162, 163, 172, 175, 176; 375/226, 215, 373, 375, 376; 331/1 R, 25; 379/9, 15.01, 93.05

(56) References Cited

U.S. PATENT DOCUMENTS

| | | | | |
|---|---|---|---|---|
| 5,672,948 A | * | 9/1997 | Cohen et al. | 318/603 |
| 6,052,034 A | * | 4/2000 | Wang et al. | 331/25 |
| 6,097,767 A | * | 8/2000 | Lo et al. | 375/376 |
| 6,212,249 B1 | * | 4/2001 | Shin | 327/156 |
| 6,222,745 B1 | * | 4/2001 | Amaro et al. | 363/65 |

\* cited by examiner

Primary Examiner—Timothy P. Callahan
Assistant Examiner—Linh Nguyen
(74) Attorney, Agent, or Firm—Blakely Sokoloff Taylor & Zafman LLP

(57) ABSTRACT

A programmable digital phase lock loop produces an output bit clock signal that is synchronized to the rising edge of a reference input signal. In the absence of the reference input signal the programmable digital phase lock loop free runs creating an output bit clock signal at a programmed frequency. Various parameters of the output bit clock signal are programmable including its period, its offset from the reference input signal and its pulse width. There is provided an adjustment in the bit clock signal in the event that the required period thereof is not an integral multiple of the base clock signal of the programmable digital phase lock loop. The adjustment occurs only in the absence of the input reference signal. When the input reference signal is present its rising edge resynchronizes the output bit clock signal to the required frequency.

26 Claims, 14 Drawing Sheets

PROGRAMMABLE DIGITAL PHASE LOCK LOOP

BACKGROUND OF THE INVENTION

A digital phase lock loop can provide an output pulse signal which is synchronized to a reference signal applied to an input of the phase lock loop. The period and all other parameters of the pulse signal are set in the hardware of the digital phase lock loop and cannot be changed without a redesign. This, in turn, precludes rapid prototyping, rapid integration into new designs and easy modification of the signal parameters in the field to meet specific user needs.

A digital phase lock loop also can provide an output pulse signal with a free running period in the absence of the reference signal at the input of the phase lock loop. The frequency or period of the free running output signal is a specified design parameter. However, if the specified running period is not an integral multiple of that of the base clock signal of the digital phase lock loop, a drift error will occur in the free running output pulse signal.

BRIEF DESCRIPTION OF THE DRAWING FIGURES

DETAILED DESCRIPTION OF THE INVENTION

Figure 1:
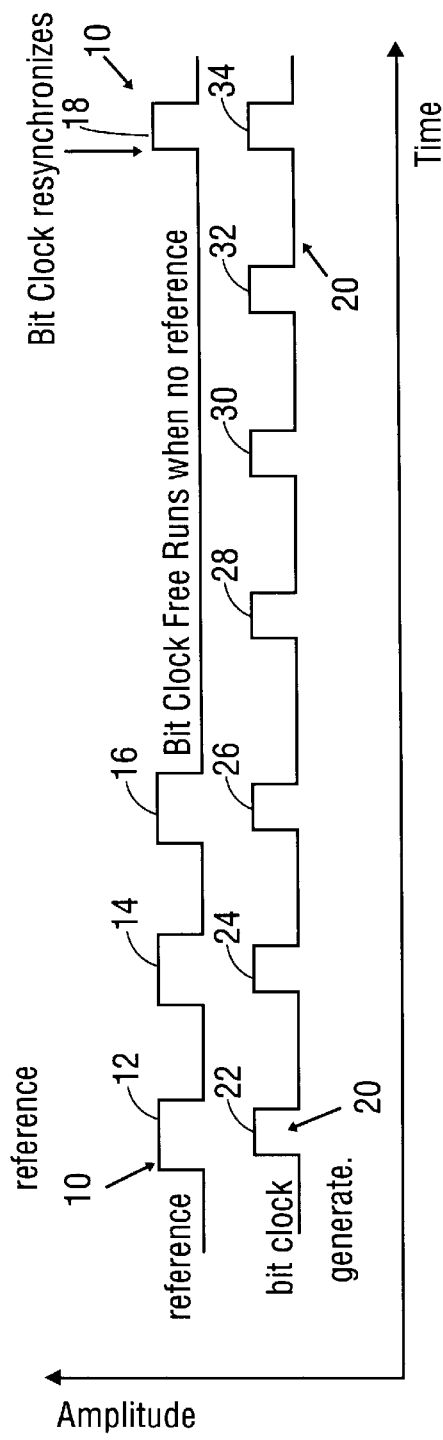
FIG. 1 is a graph including waveforms illustrating the operation of a digital phase lock loop including the applied reference input signal and the resulting output signal.

FIG. 1 illustrates the operation of a basic digital phase lock loop which provides an output pulse signal which is synchronized to a reference signal applied to an input of the phase lock loop. A reference square wave pulse input signal is shown at 10 and includes the four pulses designated 12, 14, 16 and 18. Signal 10 is illustrative of various forms of pulse data signals wherein bits of data are transmitted at a fixed rate. In the signal 10 illustrated in FIG. 1 there is a time interval between pulses 16 and 18 where no reference pulses occur. The output signal generated by the phase lock loop is designated 20 in FIG. 1 and it is a pulse signal which is synchronized to the input reference signal 10. In particular, output signal 20, also identified herein as the bit clock signal, contains a pulse generated in response to the rising edge of each pulse of the input signal 10. Thus, as shown in FIG. 1, bit clock pulses 22, 24 and 26 have rising edges which occur at a time slightly after, the rising edges of the reference signal pulses 12, 14 and 16, respectively.

During the time interval when no reference pulses are present in signal 10, i.e., between pulses 16 and 18, the bit clock signal 20 contains pulses generated at a free-running rate or frequency. Such pulses are designated 28, 30 and 32 in FIG. 1. This free-running frequency is a specified design parameter of the phase lock loop. Then, when another reference signal pulse appears, such as pulse 18 in FIG. 1, the next bit clock pulse 34 is synchronized to the reference signal, i.e. to the rising edge of the pulse 18.

Figure 2:
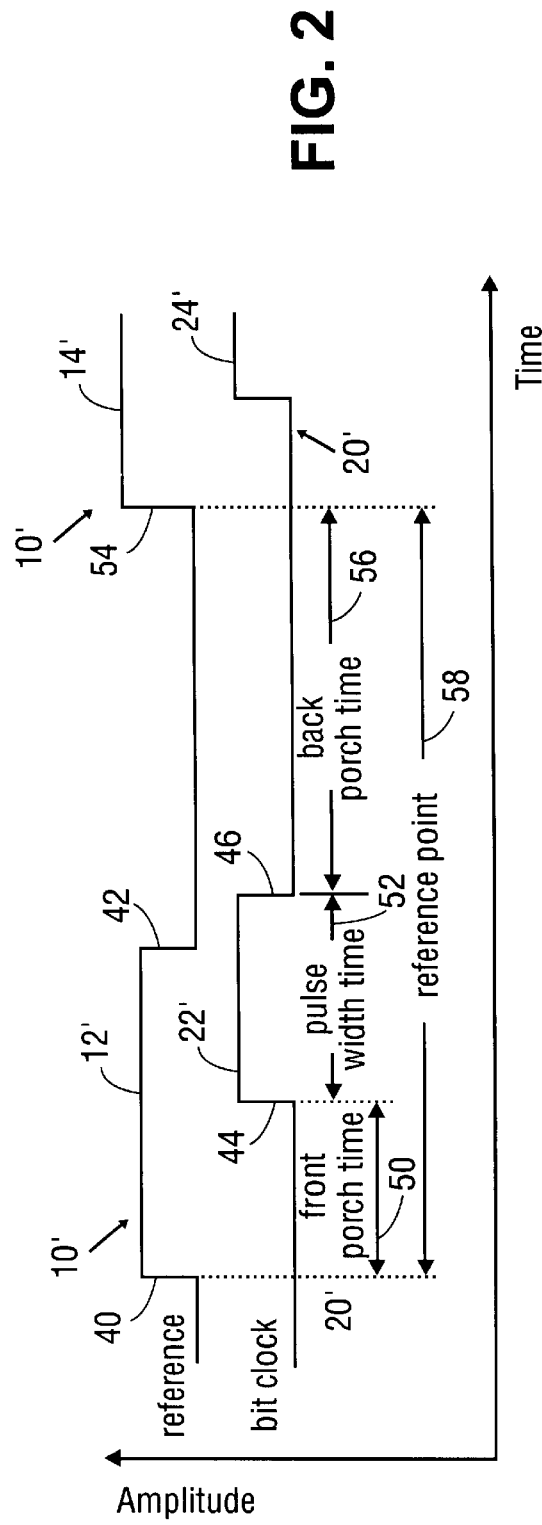
FIG. 2 is a graph including waveforms similar to those of FIG. 1 but shown in greater detail.

The relationship between the bit clock signal pulses and the reference signal pulses is illustrated in further detail in FIG. 2. Waveform 10' represents a portion of waveform 10 of FIG. 1 and includes pulses 12' and 14'. Pulse 12' has a rising or leading edge 40 and a trailing edge 42. Waveform 20' represents a portion of waveform 20 of FIG. 1 and includes pulses 22' and 24'. Pulse 22' has a rising or leading edge 44 and a trailing edge 46. The time interval or offset between the rising edges 40 and 44 of pulses 12' and 22', respectively, is indicated by arrow 50 in FIG. 2 and is also referred to herein as the front porch time. The time duration or width of pulse 22' is indicated by arrow 52 in FIG. 2 and is referred to as the pulse width time. The time interval or offset between the trailing edge of pulse 22' and the expected location of the rising edge 54 of the next reference pulse 14' is indicated by arrow 56 in FIG. 2 and is also referred to herein as the back porch time.

In accordance with the present invention, there is provided a digital phaselock loop wherein some or all of the foregoing parameters of the output signal 20, 20' are programmable. In particular, the amount of time that the rising edge 44' of the output or bit clock signal pulse 22' occurs after the rising edge 40 of the reference signal pulse 12' is programmable. Also programmable is the length of time that the bit clock signal is high, i.e. pulse width 52. The front porch 50, pulse width 52 and back porch 56 times are programmable and add up to exactly the period of the reference signal which is indicated by the arrow 58 in FIG. 2.

Figure 3:
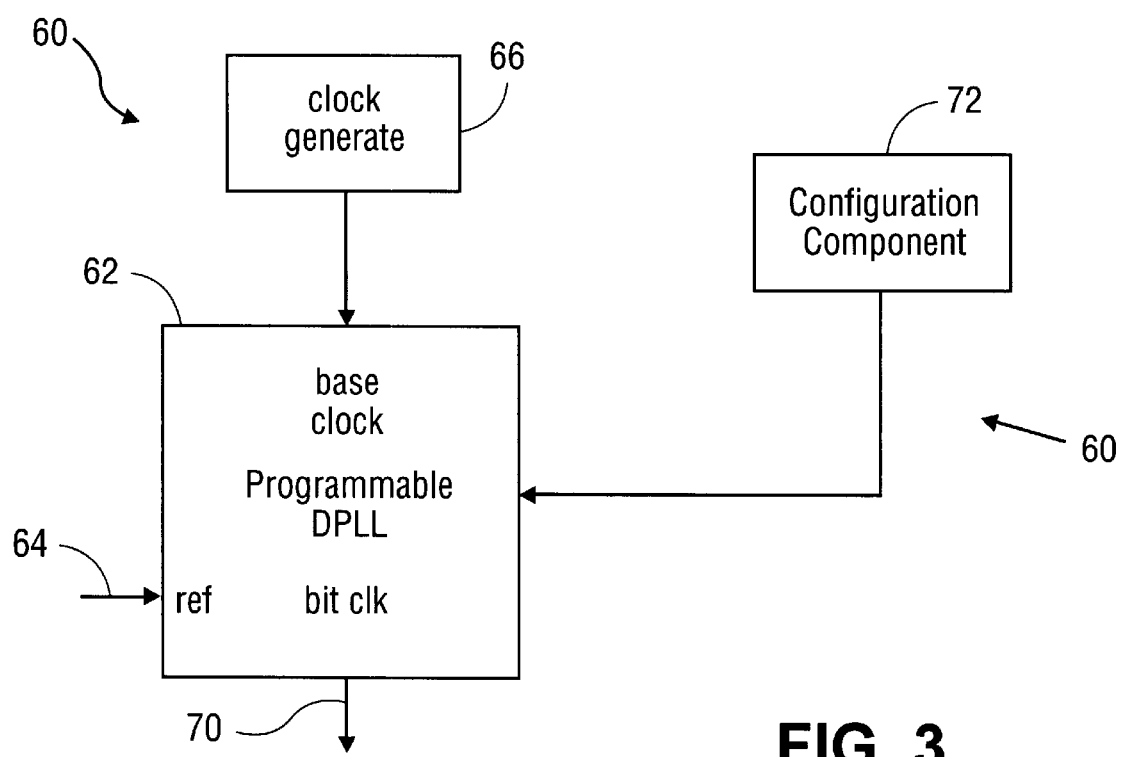
FIG. 3 is a schematic block diagram illustrating the programmable digital phase lock loop according to the present invention.

A programmable digital phase lock loop 60 according to the present invention is shown in FIG. 3. A digital phase lock loop component 62 has an input 64 for receiving a pulse signal such as signal 10, 10' illustrated in FIGS. 1 and 2. A source 66 of base clock pulses is provided, either separate from, as shown in FIG. 3, or integral with component 62. The base clock pulse signal serves as the system clock for operation of component 62 and it has a period which is orders of magnitude smaller than that of the output pulse signal provided by component 62. That output pulse signal, i.e. the bit clock signal, is generated on output 70 of component 62.

In contrast to a digital phase lock loop which is hard coded, i.e. the parameters of the output bit clock signal being set in hardware and not able to be changed without a redesign of the hardware, in accordance with the present invention the digital phase lock loop component 62 does not include such hard coding but instead includes software programmable registers. These will be shown and described presently. A configuring component is operatively associated with digital phase lock loop component 62 to program selected parameters of the output pulse signal. In the arrangement shown, the configuring component comprises a microprocessor 72 operatively connected to digital phase lock loop component 62 to program selected parameters of the output bit clock signal. The microprocessor 72 contains a program which causes the digital phase lock loop component 62 to provide the output bit clock signal synchronized to the rising edges of the pulses of the reference input signal and in the absence of a pulse of the reference signal to provide the output bit clock signal free running at a programmed frequency. Alternatively, the configuring component can comprise combinatorial or sequential logic operatively associated with digital phase lock loop component 62. In addition, the configuring component can provide the digital phase lock loop component with changeable coded values used to configure its operation.

Figure 4:
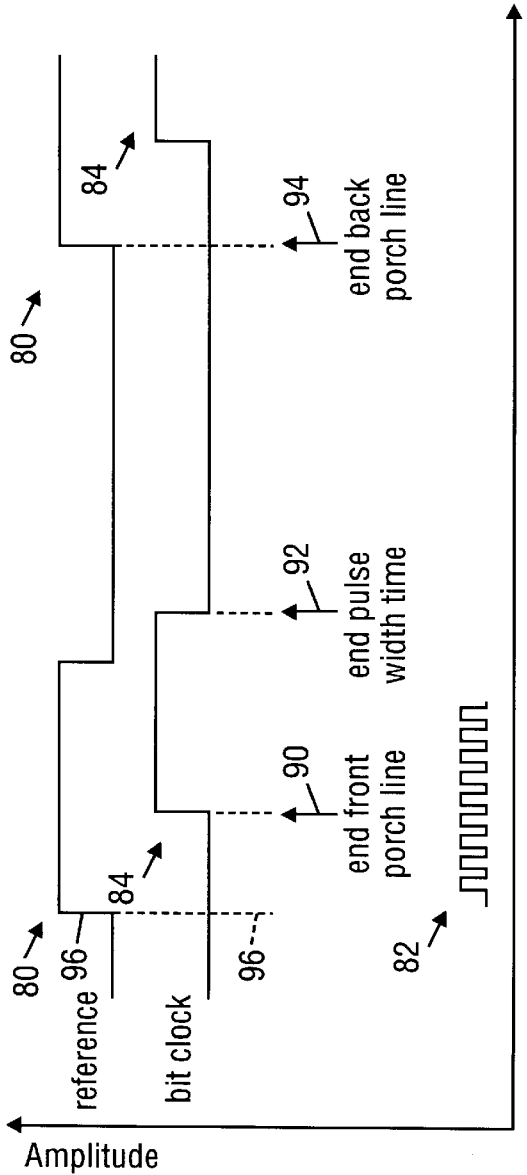
FIG. 4 is a graph including waveforms illustrating operation of the programmable digital phase lock loop of the present invention.
Figure 5:
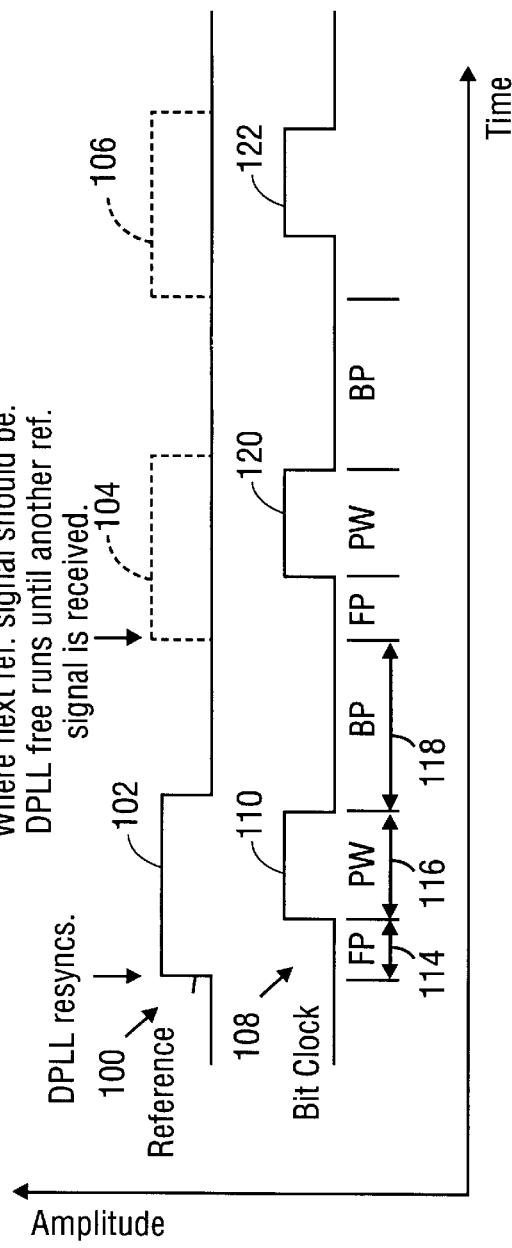
FIGS. 5–8 are graphs including waveforms illustrating the output of the programmable digital phase lock loop of the present invention under various conditions.

The waveforms of FIG. 4 illustrate the reference input 80, base clock signal 82 and output bit clock signal 84 associated with the programmable digital phase lock loop 60 of the present invention. Only a portion of the continuous base clock pulse train 82 is shown for convenience. The three programmable times that specify the bit clock signal 84 are the end front porch time 90, the end pulse width time 92 and the end back porch time 94. Each of these times is specified relative to the rising edge 96 of the reference 80. The end front porch time 90 is specified as an integral multiple of the base clock signal 82. For example, when 8-bit registers are used any value from 0 to 255 is valid. The end pulse width time 92 is specified as an integral multiple of the base clock signal 82. It has a minimum value of end front porch time plus one. The end back porch time 94 is the exact time when it is expected that the next reference pulse, in particular the rising edge thereof, will appear. If the reference pulse does not appear, the programmable digital phase lock loop enters a free run mode and,creates a bit clock signal at the programmed frequency. The end back porch time is expressed as an integral multiple of the base clock signal 82 i.e. a whole number, plus ai remainder, the remainder being expressed as a fraction X/Y for a purpose which will be described in detail presently.

The operation of the programmable digital phase lock loop 60 illustrated in FIGS. 2, 3 and 4 may be summarized by the following series of steps wherein the reference numerals identify portions of the waveforms in FIG. 2:

1. See a rising edge on reference input (40)
2. Set bit clock to low
3. Wait front porch time (50)
4. Set bit clock high (44)
5. Wait pulse width time (52)
6. Set bit clock low (46)
7. Wait back porch time (56)

In the absence of a reference pulse the foregoing sequence (steps 3 through 7) occurs at the free-running rate and continues or recycles as long as reference pulses are absent. However as soon as a reference pulse occurs, its rising edge is detected and the operation. immediately shifts to step 2. For example, if during the free running mode a reference pulse rising edge is detected while the sequence is in the step designated wait pulse width time, it does not finish that step but immediately jumps to step 2 and restarts the sequence. Similarly, if the free running sequence is in any other step (3–7) and a reference pulse rising edge is detected, that step is not finished but the operation immediately shifts to step 2.

The foregoing is illustrated further by the waveforms in FIGS. 5–8 which show the output of the programmable digital phase lock loop under various conditions. The input reference waveform 100 shown in FIG. 5 contains only one pulse 102 during the time frame under consideration. The next two reference pulses which would be expected are designated 104 and 106 in broken lines. The output bit clock waveform 108 has a pulse 110 synchronized with respect to the rising edge 112 of reference pulse 102. The front porch, pulse width and back porch times designated 114, 116 and 118, respectively, are established in reference to the time of the reference pulse rising edge 112. Then, since no further reference pulses occur during the time under consideration as viewed in FIG. 5, the subsequent output bit clock pulses 120 and 122 occur at the programmed free-running rate or frequency and with the programmed parameters of front porch time, pulse width time and back porch time.

Figure 6:
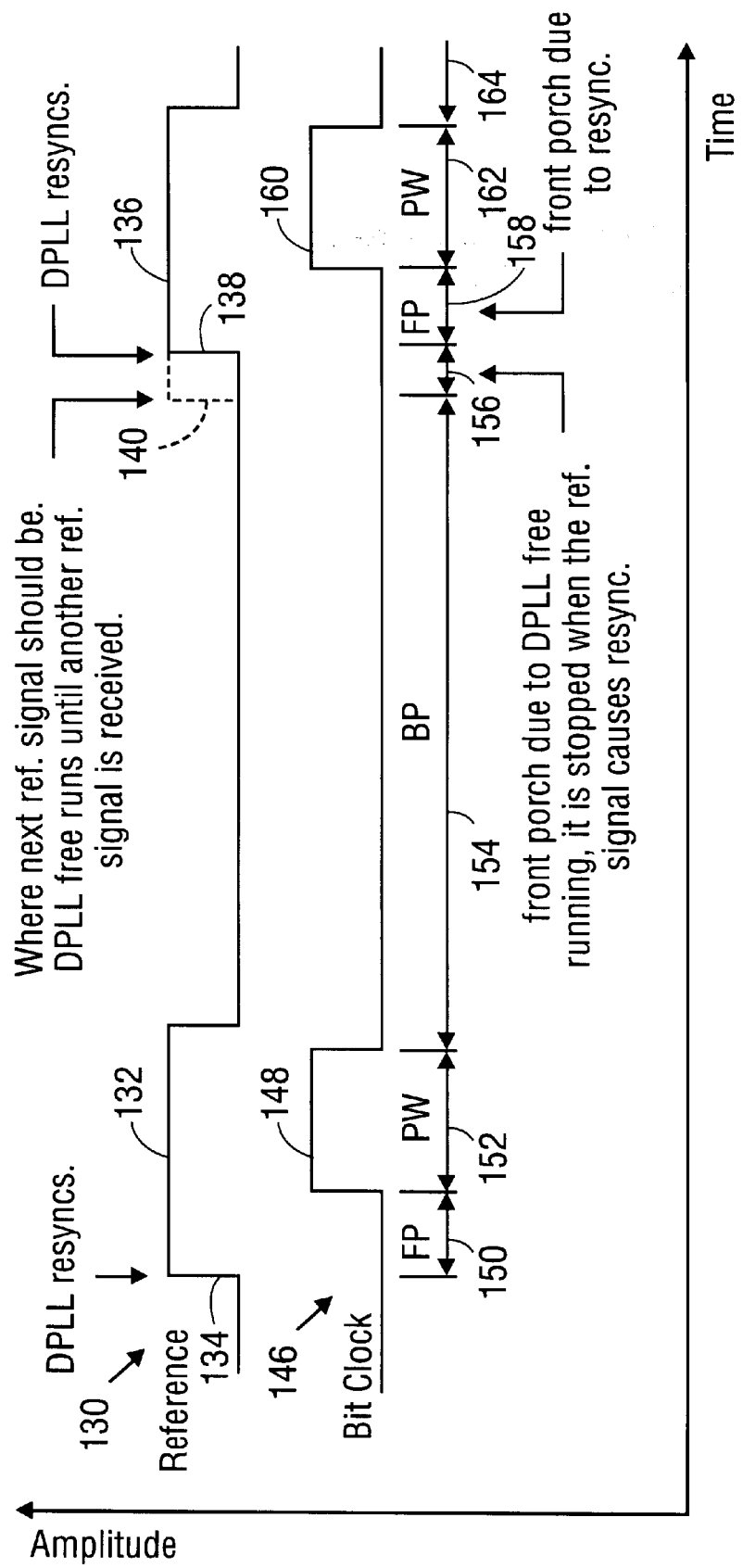

The waveforms in FIG. 6 illustrate the situation where the next reference pulse arrives at a time slightly later than its normally expected time. Waveform 130 represents the input reference signal and includes a first pulse 132 having a rising edge 134 which occurs at the normally expected time. However, the next pulse 136 occurs at a time slightly later than its normally expected time. In particular, its rising edge 138 is slightly later in time than the expected rising edge 140 shown in broken lines in FIG. 6. The time between pulses 132 and 136 shown in FIG. 6 is exaggerated for convenience in illustration as compared to the time between pulse 102 and the next expected pulse 104 shown in FIG. 5.

Waveform 146 represents the output bit clock signal and includes a pulse 148 synchronized to the rising edge 134 of reference pulse 132. Pulse 148 has front porch, pulse width and back porch times 150, 152 and 154, respectively. At the end of the back porch time 154 no reference pulse rising edge is seen so the programmable digital phase lock loop enters the free running mode and the front porch time 156 of that mode begins. However, before the end of the free-running front porch time the rising edge 138 of pulse 136 is detected whereupon the programmable digital phase lock loop immediately switches to a resynchronization mode wherein a front porch time 158 of that mode is generated. This is followed by a pulse 160 of the resynchronization mode having pulse width and back porch times 162 and 164, respectively, established in reference to rising edge 138 of pulse 136.

Figure 7:
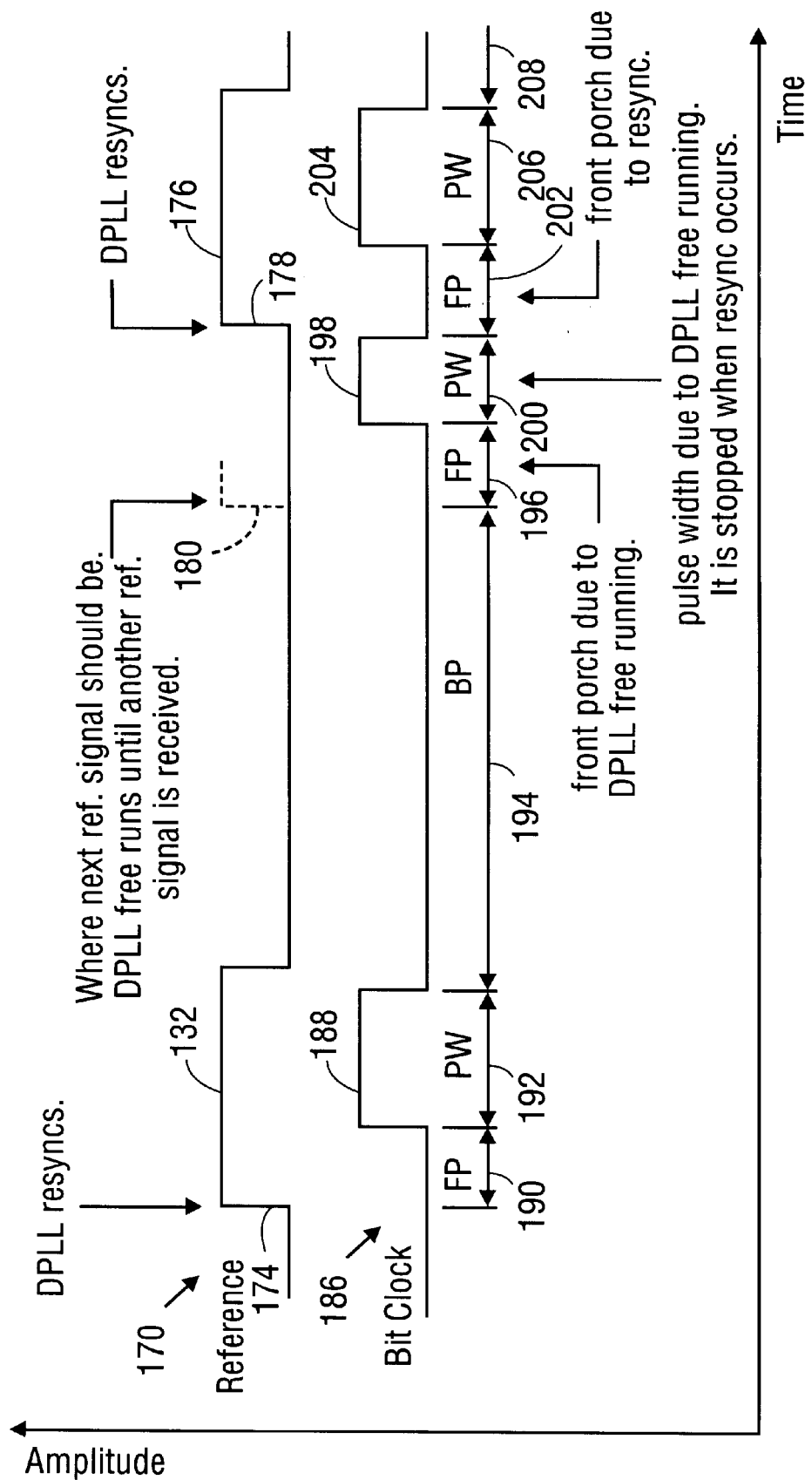

The waveforms in FIG. 7 illustrates the situation where the next reference pulse arrives at a time significantly later than its normally expected time. Waveform 170 represents the input reference signal and includes a first pulse 172 having a rising edge 174 which occurs at the normally expected time. However, the next pulse 176 occurs at a time significantly later than its normally expected time. In particular, its rising edge 178 is significantly later in time than the expected rising edge 180 shown in broken lines in FIG. 7. As with waveform 130 in FIG. 6, the time between pulses 172 and 176 shown in FIG. 7 is exaggerated for convenience in illustration as compared to the time between pulse 102 and the next expected pulse 104 shown in FIG. 5.

Waveform 186 represents the output bit clock signal and includes a pulse 188 synchronized to the rising edge 174 of pulse 172. Pulse 186 has front porch, pulse width and back porch times 190, 192 and 194, respectively. At the end of the back porch time 194 no reference pulse rising edge is seen so the programmable digital phase lock loop enters the free running mode and the front porch time 196 of that mode begins. At the end of the front porch time, no reference pulse rising edge has been seen so a pulse 198 is generated in the free-running mode having pulse width time 200. However, before the end of the pulse width time 200 the rising edge 178 of reference pulse 176 is detected whereupon the programmable digital phase lock loop immediately switches to a resynchronization mode wherein a front porch time 202 of that mode is generated. This is followed by a pulse 204 of the resynchronization mode having pulse width and back porch times 206 and 208, respectively, established in reference to rising edge 178 of reference pulse 176.

Figure 8:
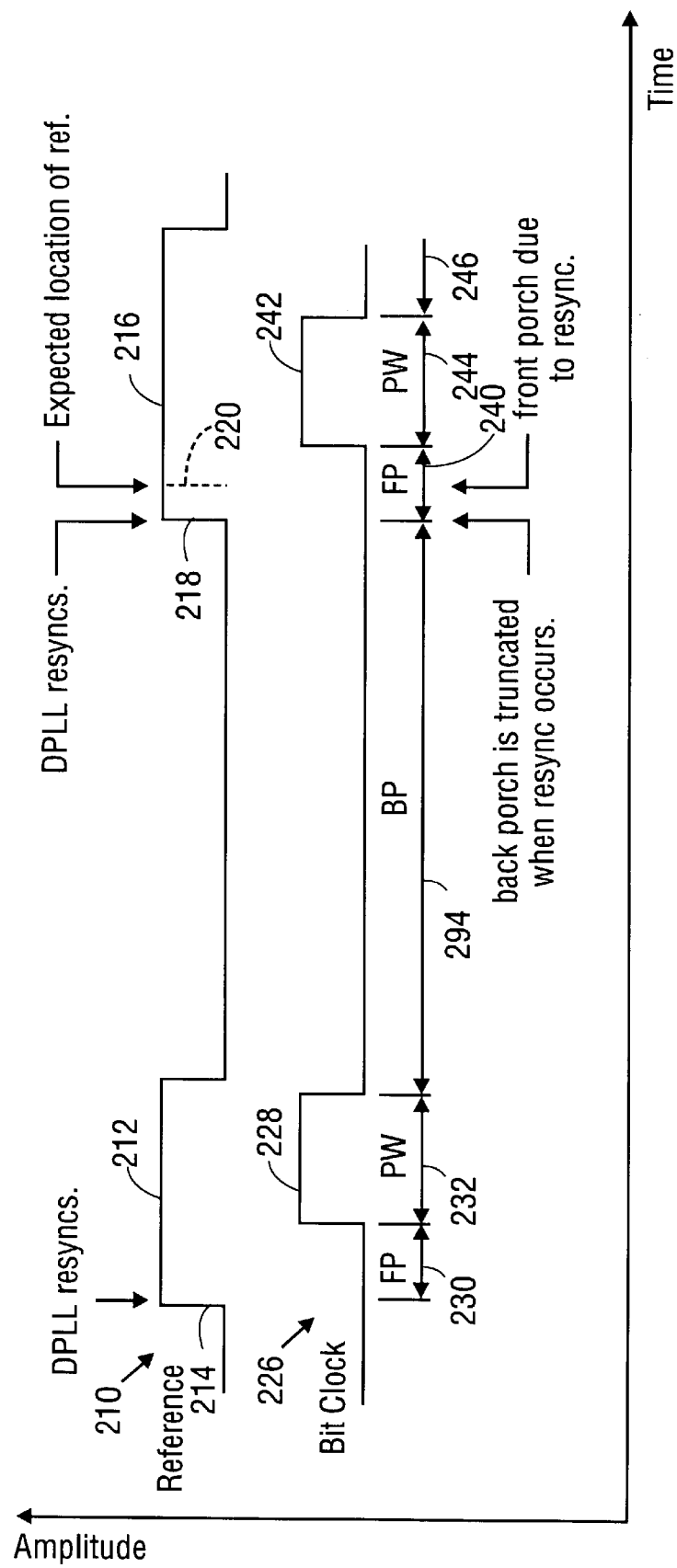

The waveforms in FIG. 8 illustrate the situation where the next reference pulse arrives at a time slightly earlier than its normally expected time. Waveform 210 represents the input reference signal and includes a first pulse 212 having a rising edge 214 which occurs at the normally expected time. However, the next pulse 216 occurs at the time slightly earlier, than its normally expected time. In particular, its rising edge 218 is slightly earlier in time than the expected rising edge 220 shown in broken lines in FIG. 8. As with waveform 130 in FIG. 6 and waveform 170 in FIG. 7, the time between pulses 212 and 216 shown in FIG. 8 is exaggerated for convenience in illustration as compared to the time between pulse 102 and the next expected pulse 104 shown in FIG. 5.

Waveform 226 represents the output bit clock signal and includes a pulse 228 synchronized to the rising edge 214 of pulse 212. Pulse 228 has front porch, pulse width and back porch times 230, 232 and 234, respectively. However, before the end of the back porch time 234 the rising edge 218 of reference pulse 216 is detected whereupon the programmable digital phase lock loop, immediately switches to a resynchronization mode wherein a front porch time 240 of that mode is generated. This is followed by a pulse 242 of the resynchronization mode having pulse width and back porch times 244 and 246, respectively, established in reference to rising edge 218 of reference pulse 216. Accordingly, the early arrival of reference pulse 216 has the effect of truncating the back porch time 234.

Thus, if the reference pulse does not appear, the programmable digital phase lock loop 60 enters a free run mode and creates a bit clock of the programmed frequency. The period of the bit clock signal is expressed as an integral multiple of the base clock plus a remainder. The remainder is expressed as a fraction, X/Y. Unless the period of the bit clock signal is an exact integral multiple of the base clock signal (i.e. the remainder is zero), a drift error will occur and the bit clock will not have the correct period. This problem is solved by the present invention by having the bit clock periodically adjusted or "stretched" to bring it back into the required period.

The following examples clarify the foregoing. In the first example, assume there is need to produce a bit clock with a free running period of 2000 nsec. and that the base clock of the programmable digital phase lock loop has a period of 250 nsec. This bit clock can be exactly created using 8 base clocks per bit clock. That is because eight times 250 nsec is exactly 2000 nsec.

In the second example, assume there is need to produce a bit clock with a free running period of 2050 nsec and the same base clock of 250 nsec. This requires 8.2 base clocks per bit clock, which is not possible since the underlying state machine uses integral multiples of the base clock. So this is where the "stretching" aspect of the present invention comes into play, as follows:

The first bit clock is created using 8 base clocks.
The second bit clock is created using 8 base clocks.
The third bit clock is created using 8 base clocks.
The fourth bit clock is created using 8 base clocks.
The fifth bit clock is created using 9 base clocks.

Figure 9:
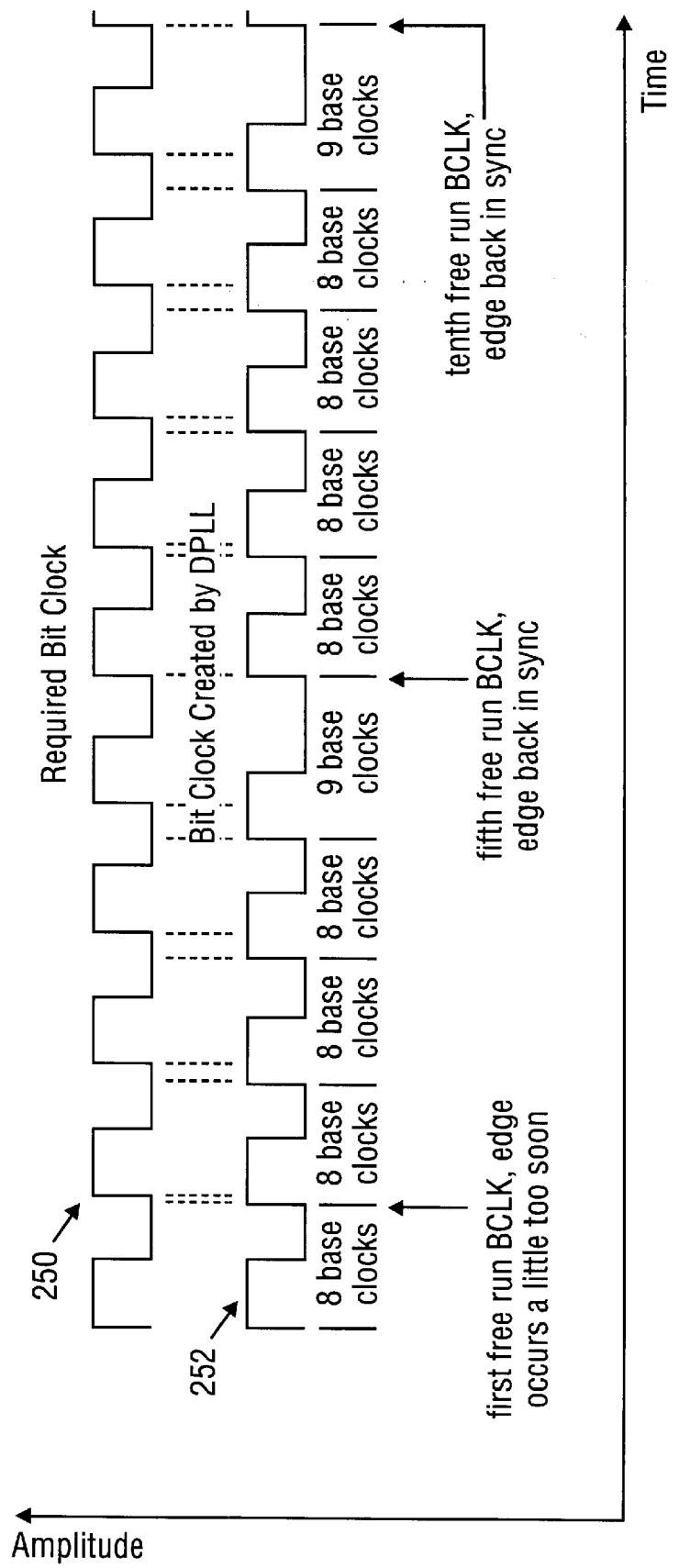
FIG. 9 is a graph including waveforms illustrating the method according to the present invention for adjusting the period of the free running output signal when it is not an integer multiple of that of the base clock of the digital phase lock loop.

The foregoing is illustrated in FIG. 9 wherein waveform 250 represents the required bit clock signal and waveform 252 represents the resulting bit clock generated by the programmable digital phase lock loop of the present invention. As can be seen, every fifth bit clock pulse lines up exactly with the required clock. While the in between clocks are slightly off (FIG. 9 shows the errors greatly exaggerated for viewing), the errors are predictable and do not vary during any lengths of the free run periods.

To produce the bit clock signal 252 shown in FIG. 9, one must use a "stretch" pattern having a binary representation of 00001, i.e. one bit clock in five is stretched by an additional base clock. Actually any five bit pattern that contains a single one will work (00001, 00010, etc). To program the programmable digital phase lock loop of the present invention for the foregoing example one must specify a front porch, pulse width and back porch so that the sum of the three values is eight (the integer part of 8.2), and additional one programs a pattern length of five and a pattern of 00001 (binary). The pattern length and pattern specify the fractional part of 8.2, namely ⅕. Once programmed, when the programmable digital phase lock loop is free running it creates the desired output by "stretching" the back porch time by one base clock every five bit clocks. This produces the output shown in FIG. 9.

As a real world example, assume a bit clock of 2000 nsec is needed and there is available a DPLL base clock. of 122.07 nsec (8.192 Mhz). Dividing the period of the bit clock by the period of the base clock yields 16.3840 base clocks per bit clock and requires use of a combination of 16 and 17 base clocks per bit clock. The remainder 0.3840 is almost exactly 5/13 (0.3846). Therefore, using a pattern length of thirteen and a pattern that contains five ones (ex. 0010010010101) can produce a very good approximation of the required 2000 nsec bit clock. While it is true that during very long free run periods the bit clock will drift since 5/13 is not exactly 0.3840, this is the best that can be done given the constraint of a pattern of no more than 16 bits due to the size of the registers employed.

Therefore, to specify the 2000 nsec bit clock the following values are needed:

1. front porch, pulse width and back porch values such that their sum is 16
2. pattern length=13 (the denominator of the remainder)
3. pattern=0010010010101 (the pattern must contain as many ones as the value of the numerator of the remainder and must be as long as the denominator of the remainder)

In order to minimize the drifterrors in the bit clock signal, the added base clock pulses, i.e. the binary one representations, should be spread as evenly as possible throughout the pattern. This is evident in the foregoing example where in the pattern 0010010010101 the added base clock pulses represented by the binary ones are spread evenly over the length of the pattern. By way of further example, with X=2 and Y=7 the pattern could be 0010010 and with X=5 and Y=13 an alternate pattern from the one previously presented could be 0101010010010.

To summarize, the programmable digital phase lock loop of the present invention produces an output bit clock signal that is synchronized to the rising edge of a reference input signal. In the absence of the reference input signal the, programmable digital phase lock loop free runs creating an output bit clock signal at a programmed frequency. Various parameters of the output bit clock signal are programmable including its period, its offset from the reference input signal and its pulse width. There is provided according to the present invention an adjustment in the bit clock signal in the event that the required period thereof is not an integral multiple of the base clock signal of the programmable digital phase lock loop. The adjustment occurs only in the absence of the input reference signal. When the input reference signal is present its rising edge resyhchronizes the output bit clock signal to the required frequency.

The foregoing adjustment is provided by first dividing the desired period of the bit clock signal by the known period of the base clock signal to obtain a result in the form of a whole number and a fractional remainder. The whole number or integer is the basic, unadjusted number of base clock periods in each bit clock period, i.e. the number of base clock pulses during each period of the output bit signal. The denominator of the fractional remainder defines the number of bit clocks contained in an adjustment set. The numerator of the fractional remainder specifies how many bit clocks in the adjustment set are "stretched" by one additional base clock period. A binary pattern is used to specify the exact bit clocks in the adjustment set that should be "stretched". A value of one in the pattern denotes to stretch the bit clock while a zero denotes don't stretch. The ones within the pattern are arranged or spread over the length of the pattern as evenly as possible. Each successive bit clock contains either the number of base clocks specified by the integer part of the division or one additional base clock. Of course, if dividing the desired period of the output bit clock signal by the known period of the base clock produces an integral result with no remainder, the adjustment set reduces to null and no bit clocks are "stretched".

Figure 10:
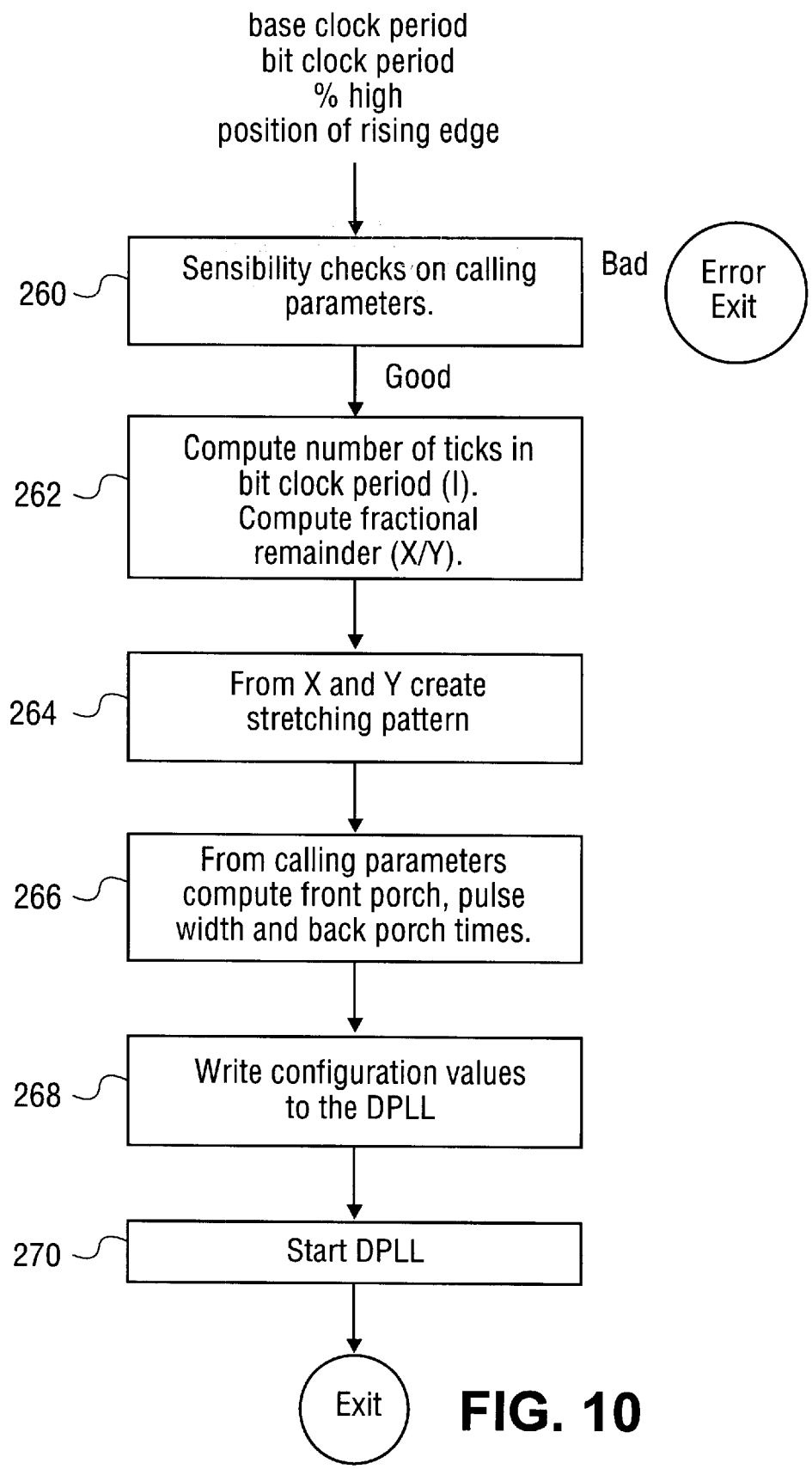
FIG. 10 is a flow chart further illustrating the method of the present invention.

The programmable digital phase lock loop of the present invention is initialized to perform the foregoing operations by software represented by the flow chart of FIG. 10. In stage 260 sensibility checks are performed on the calling parameters input thereto including the base clock period, the bit clock period, percent the bit clock period that the bit clock pulse is high (another way of specifying the bit clock pulse width), and the position of the rising edge of the reference pulse. In the next stage 262 the number of base clock ticks in the bit clock period is computed, this number being designated I. This is the number of base clock periods in each bit clock period described hereinabove. Also in stage 262 the fractional remainder x/y is computed. In the next stage 264 the stretching pattern is created from the values of x and y. In particular, as previously described, y defines the number of bit clock periods over which each successive adjustment will occur, i.e. it defines the length of the stretch pattern. X defines the number of base clock periods, i.e. the number of base clock pulses, that will be added during each length y of the stretch pattern. Also in this stage a relatively uniform distribution of x over y can be arranged.

In the next stage 266 of the software program, the front porch, pulse width and back porch times are computed from the calling parameters. The configuration values are written to the programmable digital phase lock loop during the next stage 268. The last stage 270 starts operation of the programmable digital phase lock loop.

Figure 11:
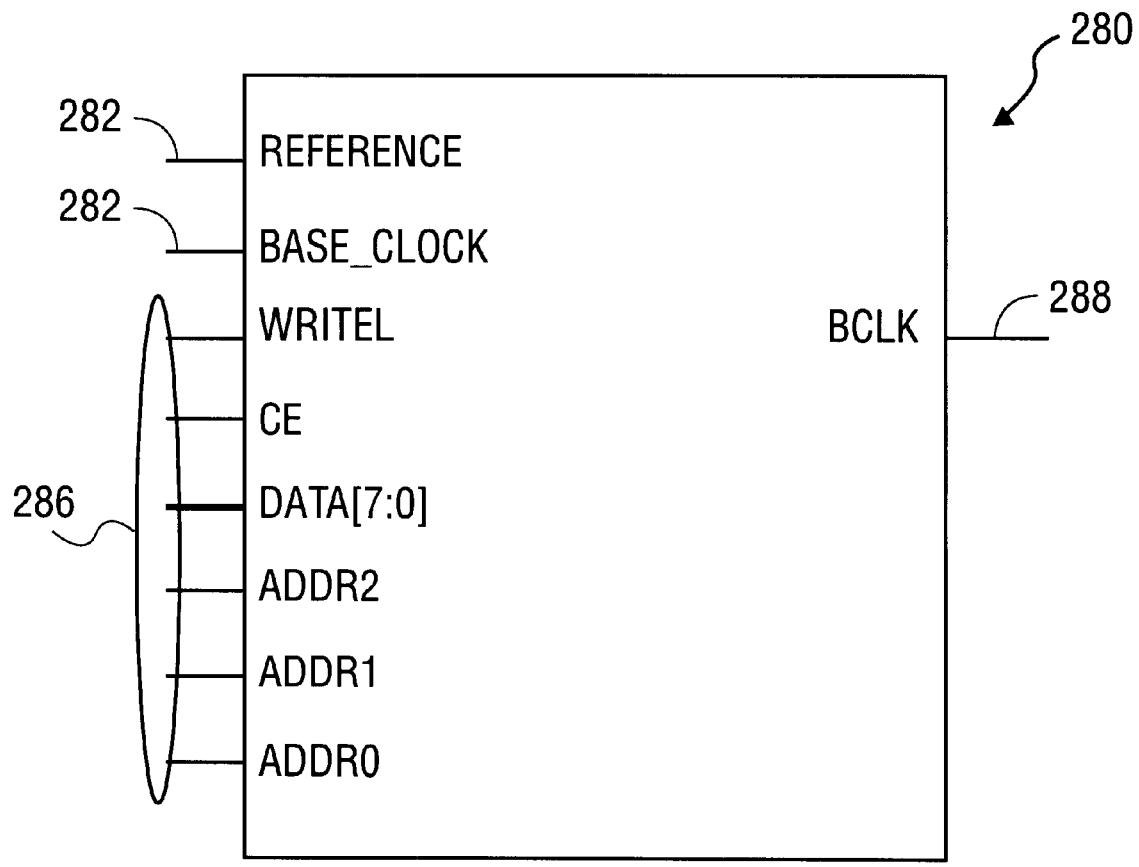
FIGS. 11–15 are schematic diagrams illustrating a preferred implementation of the programmable digital phase lock loop of the present invention.

FIGS. 11–15 illustrate a preferred implementation of the programmable digital phase lock loop of the present invention. FIG. 11 is a top level diagram of the programmable digital phase lock loop 280 of the present invention which is analogous to component 62 shown in FIG. 3. The reference signal is applied to input 282 and the base clock pulses from an appropriate source, such as source 66 shown in FIG. 3, are applied to input 284. The inputs collectively designated 286 in FIG. 11 are the data, address and command signals received from a source of program signals such as a configuring component like microprocessor 72 in the arrangement of FIG. 3. The generated bit clock signal is provided on output 288.

Figure 12:
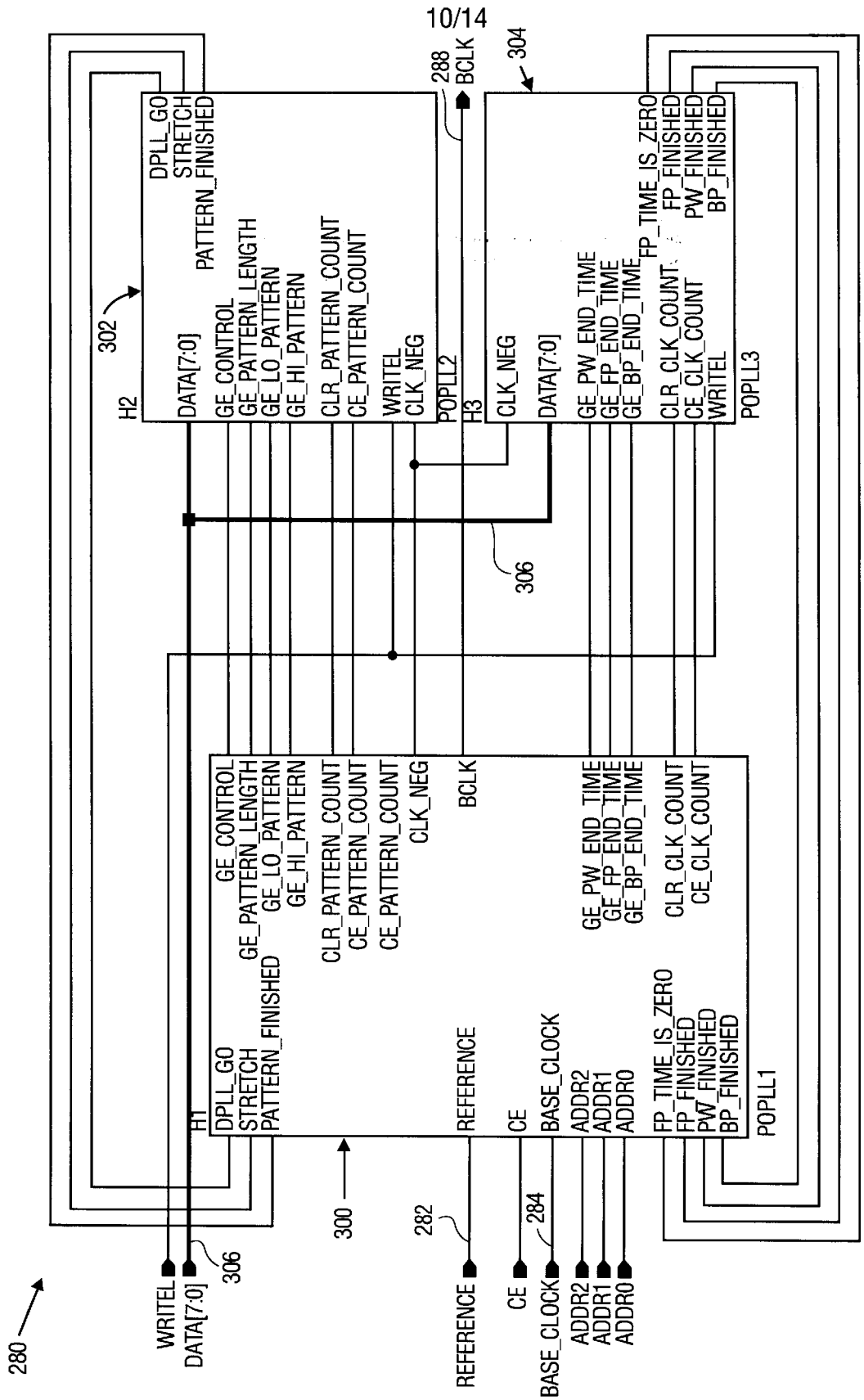

The programable digital phase lock loop 280 has three principal functional components designated 300, 302 and 304 in FIG. 12. Component 300 controls generation of the output bit clock signal and adjustment of the period of the bit clock signal. Component 302, under control of component 300 and in response to program data signals from the aforementioned microprocessor, provides the adjustment in the period of the bit clock signal. Component 304, under control of component 300 and in response to program data signals from the aforementioned microprocessor, generates the output bit clock signal. The program data signals are transmitted via a bus 306.

Figure 13:
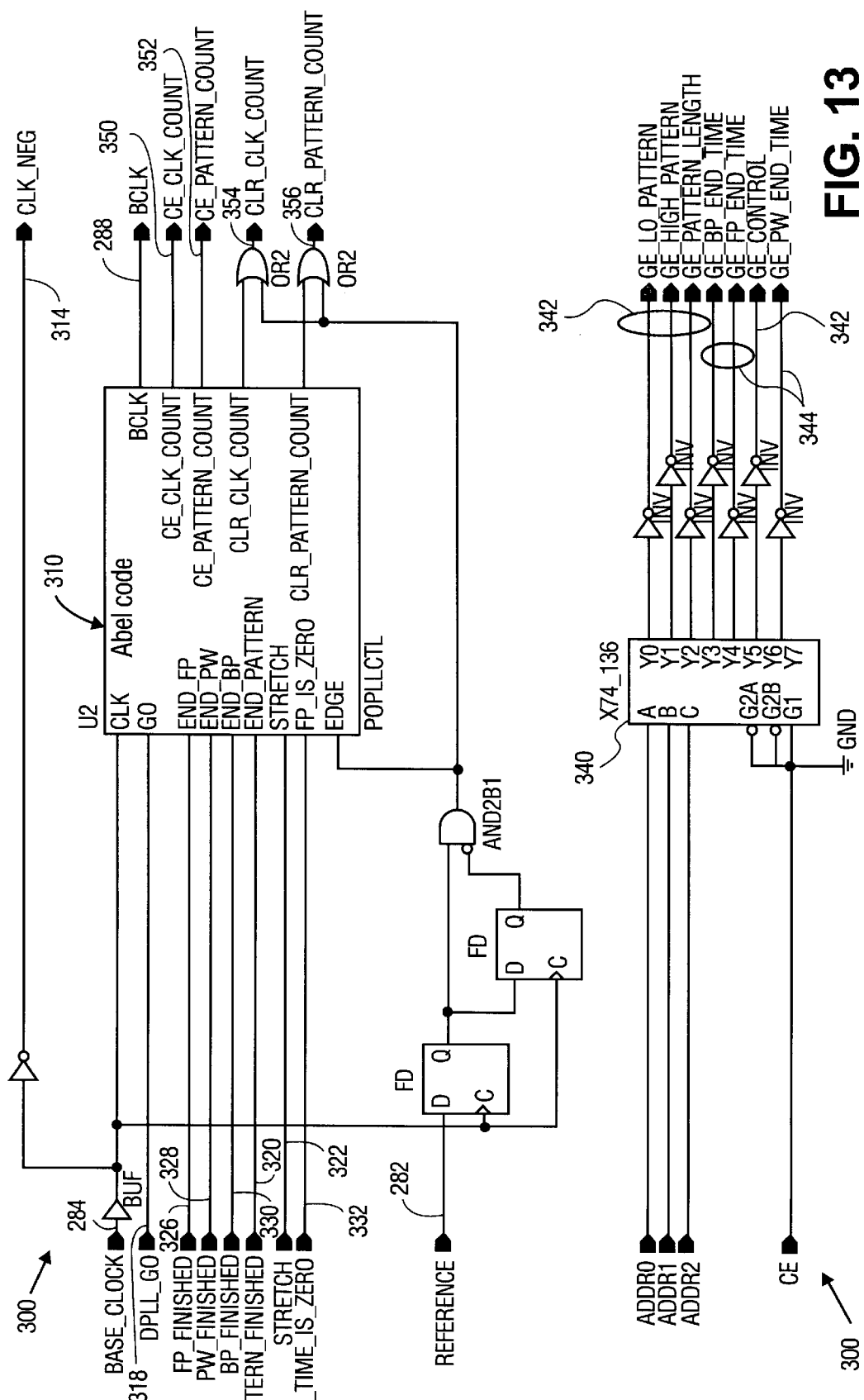

Component 300 is shown in detail in FIG. 13. A processor 310 is operated by an underlying HDL (hardware description language) file that will be described presently. HDL is similar to a software program but it is translated into hardware. Like software, HDL can be written in many formats, and for the implementation illustrated herein ABEL is used. Processor 310 receives the base clock input 284, and the base clock signal is inverted and applied to an input 314 of component 302. Inputs 318, 320 and 322 are received from component 302 and input 318 controls the on/off state of the output bit clock signal. Inputs 320 and 322 provide information on the bit clock period adjustment. Inputs 326, 328, 330 and 332 are received from component 304 and provide information on the output bit clock signal parameters. The reference signal input 282 is processed by a network of D flip-flops and a gate to provide information to processor 310 indicating the presence or absence of the rising edge of the reference input. The address and control inputs shown in FIG. 11 are processed by a decoder 340 and arrangement of inverters to provide inputs collectively designated 342 to component 302 and inputs collectively designated 344 to component 304.

Processor 310 provides the generated bit clock signal on output 288. It also provides clock count and pattern count control signals 350 and 352, respectively, which are utilized by components 304 and 302, respectively. Processor 310 also provides clock count and pattern count clear signals 354 and 356, respectively, which are utilized by components 304 and 302, respectively.

Figure 14:
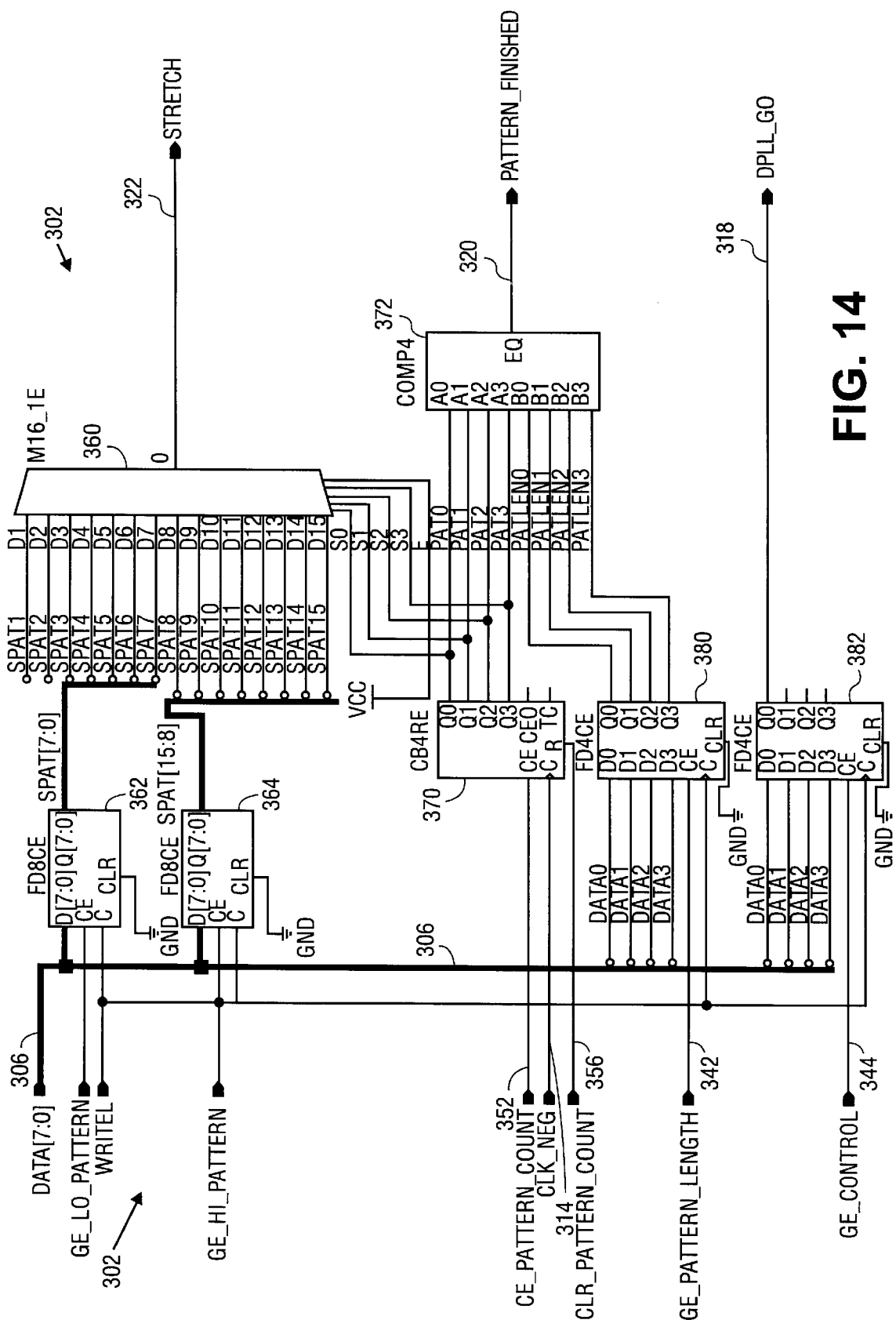

Referring now to FIG. 14, component 302 includes a data selector 360 which provides an output in the form of a binary representation of the stretch pattern, such, as the pattern 0010010010101 indicated in the previously described example. This output provides the input 322 to processor 310 of component 300. Inputs to data selector 350 are provided by flip flops 362 and 364 which, in turn, receive the program data signals via bus 306. The program data signals contain the information on the zeros and ones in the stretch pattern. Flip flops 362 and 364 also receive the indicated control signals from component 300 and the write command signal.

Component 302 also includes a counter 370 which provides outputs to selection lines of data selector 360 and to inputs of a comparator 372. Counter 370 receives the inverted base clock input 314 from component 300 and the pattern count control and clear signals 352 and 356, respectively from component 300. Counter 370 counts up to the length of the stretch pattern.

Component 302 further includes a pair of programmable registers 380 and 382, both of which receive program data signals via bus 306. The outputs of register 380 provide the remaining inputs to comparator 372. The output of comparator 372 provides the input 320 to processor 310 of component 300 and contains information on the stretch pattern. Register 380 also receives one of the inputs 342 from component 300 as well as the write command signal. The output of register 382 provides the bit clock on/off state input 318 to processor 310 of component 300. It receives one of the inputs 344 from component 300 as well as the write command signal.

Figure 15:
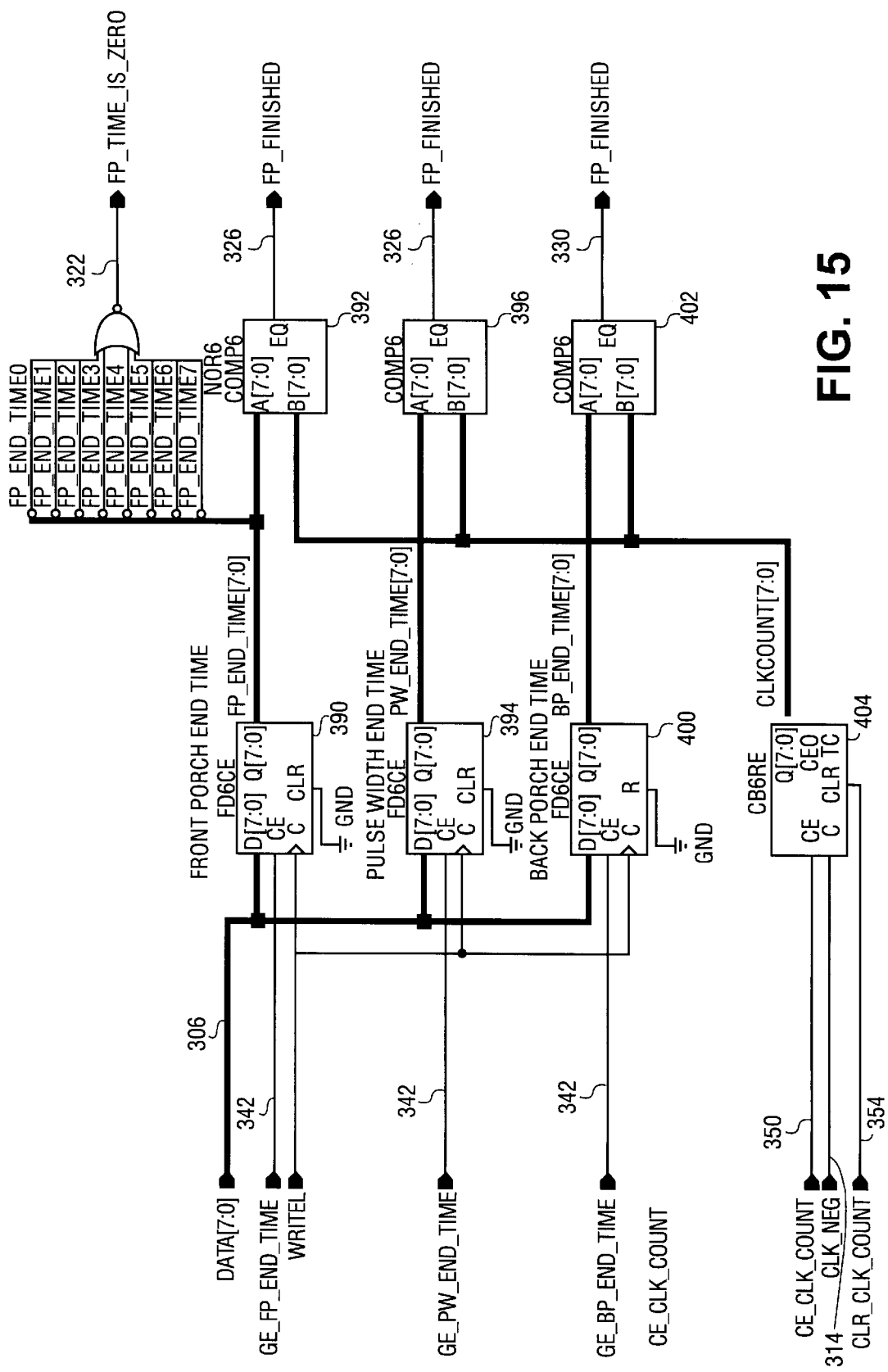

Referring now to FIG. 15, component 304 includes three branches for establishing the front porch end time, the pulse width end time and the back porch end time. The front porch end time branch includes a flip flop 390 and a comparator 392. Flip flow 390 receives program data signals via bus 306, one of the inputs 342 from component 300 and the write command signal. The output on flip flop 390 is one of the inputs to comparator 392. The pulse width end time branch includes a flip flop 394 and a comparator 396. Flip flop 394 receives program data signals via bus 306, one of the inputs 342 from component 300 and the write command. The output of flip flop 394 is one of the inputs to comparator 396. The back porch end time branch includes a flip flop 400 and a comparator 402. Flip flop 400 receives program data signals via bus 306, one of the inputs 342 from component 300 and the write command. The output of flip flop 400 is one of the inputs to comparator 402.

The other inputs to comparators 392, 396 and 402 are obtained from the output of a counter 404. Counter 404 receives the inverted base clock input 314 from component 300 and the clock count control and clear signals 350 and 354, respectively, from component 300. Counter 404 counts up to the sum of the front porch, pulse width and back porch times. The outputs of comparators 392, 396 and 402 are the inputs 326, 328 and 330, respectively for processor 310 of component 300. The output of flip flop 390 also is inverted to provide the in put 332 to processor 310.

As previously described, processor 310 is operated by an underlying HDL file. The following is the ABEL implementation of that file.

```
 1: "
 2: "
 3: "
 4: "
 5: "
 8: "Filename: PDPLLCtl.abl
 9: "Description:
10: "Controls the generation of the Bit Clock (BCLK) which
11: "is synchronized to the Edge input. The Bit Clock has three sections
12: "Front Porch (FP)—time from the Edge input to the rising edge of
13: BCLK, Pulse (PW)—how long the BCLK is high, and Back Porch (BP)—time
14: "from falling edge of BCLK until the next Edge input is expected. The
15: length of each is determined by external registers.
16: "
17: "On each Edge input the state machine resynchronizes and creates the
18: "required BCLK. If the Edge input does not occur, the state machine
19: "free runs until the next Edge input.
20: "
21:
22: module PDPLLCtl
23: Title 'PDPLLCtl'
24:
25: Declarations
26:
27: "clocks
28: Clk PIN;
29:
30: "inputs
31: Edge PIN;
32: Go PIN;
33: End_PW PIN;
34: End_FP PIN;
35: End_BP PIN;.
36: Stretch PIN;
37: End Pattern PIN;
38: FP_Is_Zero PIN;
39:
40: "outputs
41: BCLK PIN;
42: CE_Clk_Count PIN;
43: Clr_Clk_Count PIN;.
44: CE_Pattern_Count PIN;
45: Clr_Pattern_Count PIN;
46:
47: "state registers
48: sb3,sb2,sb0 node lstype 'reg';
49: st_reg=[sb3,sb2,sb1,sb0];
50:
51: "states for machine
52: "
53: reset=[0, 0, 0, 0]; "reset state must be zeroes
54: po=[0, 0, 0, 1]; "process front porch
55: ph=[1, 0, 0, 1]; "process pulse width
56: "keep ph only state with sb3=1, so bit clock
57: "is direct output of flip-flop (no glitches)
58: pp=[0, 1, 0, 0]; "process back porch
59: clr=[0, 1, 1, 0]; "clear counter
60: strch=[0, 1, 0, 1]; "stretch bclk
61:
62:
63: Equations
64:
65: st_reg.clk=Clk;
66: [sb3,sb2,sb1,sb0].ar=(!Go);
67:
68: BCLK=sb3;
69:
70: CE_Clk_Count=(st.reg==po)#
71: (st_reg==ph)#
72: (st_reg==pp);
73:
74: Clr_Clk Count=(st_reg==clr)#(st_reg==reset);
75:
76: CE_Pattern_Count=(st_reg==clr) & !End_Pattern;
77:
78: Clr_Pattern_Count=((st_reg==clr) & End_Pattern)#
79: (st_reg==reset);
```

```
80:
81:
82: State_Diagram st_reg;
83:
84: State reset: if (FP_Is_Zero) then ph
85: else po;
86:
87: "process the front porch, until end
88: "if we get an edge restart
89: State po: if(!Edge & End_FP) then ph
90: else if (!Edge & !End_FP)then po
91: else if (Edge & FP_Is_Zero) then ph
92: else po;
93:
94: "process the Pulse Width, until end
95: "if we get an edge restart
96: State ph: if (!Edge & End_PW) then pp
97: else if (!Edge & !End_PW) then ph
98: else if (Edge & FP_Is_Zero) then ph
99: else po;
100:
101: "process the back porch, until end
102: "if we get an edge restart
103: State pp: if (!Edge & End_BP) then clr
104: else if (!Edge & !End_BP) then pp
105: else if (Edge & FP_Is_Zero) then ph
106: else po;
107:
108: "do we have to stretch?
109: "if we get an edge restart
110: State clr: if (!Edge & Stretch) then strch
111: else if (!Edge & !Stretch & EP_Is_Zero) then ph
112: else if (!Edge & !Stretch & !FP_Is_Zero) then po
113: else if (Edge & FP_Is_Zero) then ph
114: else po;
115:
116: "stretch by one clock
117: "if we get an edge restart
118: State strch: if (!Edge & FP_Is_Zero) then ph
119: else if (!Edge & !FP_Is_Zero) then po
120: else if (Edge & FP_Is_Zero) then ph
121: else po;
122:
123: end PDPLLCtl
```

Figure 16:
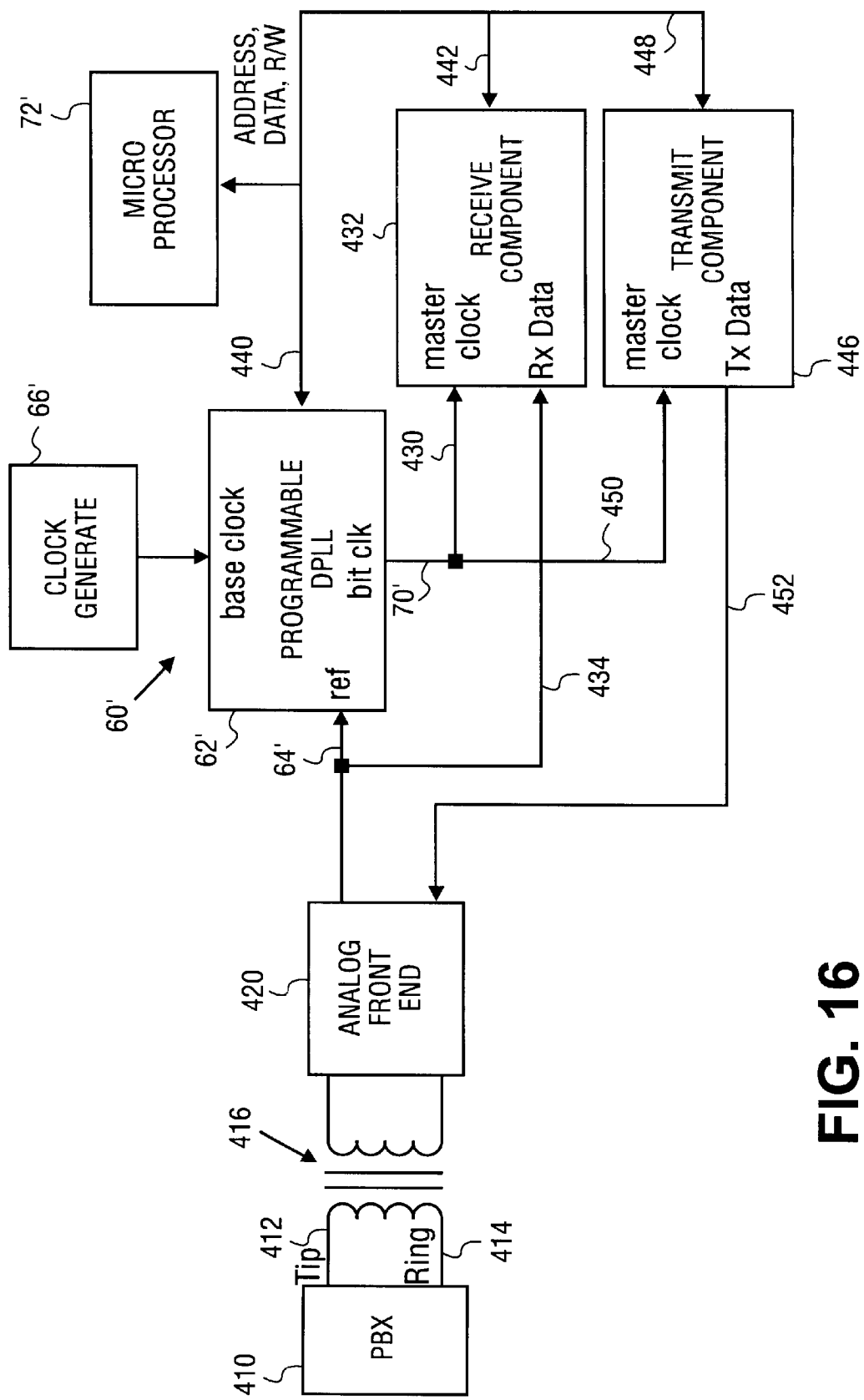
FIG. 16 is a schematic block diagram illustrating use of the programmable digital phase lock loop of the present invention in a telephony application.

FIG. 16 illustrates use of the programmable digital phase lock loop of the present invention in a telephony application, in particular a telephone emulation. Components in the arrangement of FIG. 16 identical to these shown in FIG. 3 are identified by the same reference numeral with a prime designation. A telephony switch or PBX 410 has the tip 412 and ring 414 signal lines thereof coupled through a transformer 416 to an analog front end component 420 of the illustrated arrangement which functions as an analog to digital converter. An output of analog front end 420 provides the reference signal input 64' to component 62' of the programmable digital phase lock loop 60'. The output bit clock signal from component 62' is applied via line 430 to a master clock input of a receive component 432. The digital reference signal from analog front end 420 is applied via line 434 to a data input of receive component 432. The bit clock signal on line 430 generated by the programmable digital phase lock loop of the present invention tells receive component 432 when to look at the data signal on line 434, during each period of the data signal, for the purpose of extracting data from that signal. The bit clock signal on line 430 also contains information on the data rate of the signal on line 434.

Microprocessor 72' is connected via a bus section 440 to component 62' and via a bus station 442 to receive component 432. Receive component 432 converts the serial data it receives from the signal on line 434 to parallel data for use by microprocessor 72'. Microprocessor 72', in turn, uses that parallel data to determine the various telephony operations commanded by PBX 410, i.e. that an indicator is to light up on a particular telephone set, that a particular set is to ring, etc. Since the telephone set is emulated by microprocessor 72', no physical telephone set is shown in FIG. 16.

The illustrative arrangement of FIG. 16 also includes a transmit component 446 which is connected to microprocessor 72' via a bus section 448. The output bit clock signal from component 62' is applied via line 450 to a master clock input of transmit component 446. A data output of component 446 is connected via line 452 to an input of analog front end 420. Transmit component. 446 takes parallel data from microprocessor 72' and converts it to serial data for transmission to PBX 410. This data tells PBX 410 about telephony events which have occurred, i.e. that a button on a particular telephone set was pushed, that a set went off hook, etc. The bit clock signal on line 450 controls the rate at which the data is transmitted from component 446 to PBX 410.

The foregoing is merely illustrative of the many uses for the programmable digital phase lock loop of the present invention in which data must be recovered from a serial stream and in which it is desired to create an accurate clock that will free run for an extended period.

While an embodiment of the present invention has been described in detail, that has been done for the purpose of illustration, not limitation.

We claim:

1. A programmable digital lock loop comprising:

a) a digital phase lock loop having an input to receive a reference signal, a source of base clock signals and an output to provide an output pulse signal synchronized with the reference signal, wherein the reference signal is a pulse signal; and b) a configuring component operatively associated with the digital phase lock loop to program selected parameters of the output pulse signal, wherein the configuring component contains a program for determining the pulse width time of the output signal and at least one offset time between the output signal and the reference signal.

2. A programmable digital lock loop comprising:

a) a digital phase lock loop having an input to receive a reference signal, a source of base clock signals and an output to provide an output pulse signal synchronized with the reference signal; and b) a configuring component operatively associated with the digital phase lock loop to program selected parameters of the output pulse signal, wherein the configuring component contains a program for adjusting the period of the output signal in the event that the period is not an integral multiple of the period of the base clock signal.

3. A programmable digital lock loop comprising:
a) a digital phase lock loop having an input to receive a reference signal, a source of base clock signals and an output to provide an output pulse signal synchronized with the reference signal; and
b) a configuring component operatively associated with the digital phase lock loop to program selected parameters of the output pulse signal, wherein the configuring component contains a program for adjusting the period of the output signal in the event that the period is not an integral multiple of the base clock signal, the program computing the number of base clock periods in the period of the output signal to obtain a result in the form of a whole number and a fractional remainder if any, the program utilizing the whole number to specify the unadjusted number of base clock periods in each period of the output pulse signal, the program utilizing the denominator of the fractional remainder to determine an adjustment set equal to the number of periods of the output pulse signal over which the adjustment will occur, and the program utilizing the numerator of the fractional remainder to determine the number of output pulse clock periods in the adjustment set to which a base clock period is added for the adjusting.

4. The programmable digital phase lock loop according to claim 3, wherein the program contained in the configuring component includes a portion for spreading the added base clock periods relatively evenly over the adjustment set.

5. A system for analyzing a reference signal representing bits of data and comprising a series of pulses propagating at a fixed rate and each having a rising edge, the system comprising:
a) a digital phase lock loop having an input to receive the reference signal and providing an output bit clock signal, the bit clock signal being related to the reference signal in a manner providing information on the times at which data can be extracted from the reference signal;
b) a source of base clock signals connected to the digital phase lock loop and having a frequency many times that of the bit clock signal; and
c) a configuring component operatively associated with the digital phase lock loop to program selected parameters of the bit clock signal, wherein the configuring component contains a program for determining the pulse width time of the output bit clock signal and at least one offset time between the output bit clock signal and the reference signal.

6. A system for analyzing a reference signal representing bits of data and comprising a series of pulses propagating at a fixed rate and each having a rising edge, the system comprising:
a) a digital phase lock loop having an input to receive the reference signal and providing an output bit clock signal, the bit clock signal being related to the reference signal in a manner providing information on the times at which data can be extracted from the reference signal;
b) a source of base clock signals connected to the digital phase lock loop and having a frequency many times that of the bit clock signal; and
c) a configuring component operatively associated with the digital phase lock loop to program selected parameters of the bit clock signal, wherein the configuring component contains a program for adjusting the period of the output bit clock signal in the event that the period is not an integral multiple of the period of the base clock signal.

7. The system according to claim 6, wherein the program computes the number of base clock periods in the period of the output bit clock signal to obtain a result in the form of a whole number and a fractional remainder, if any, the program utilizing the whole number to specify the unadjusted number of base clock periods in each period of the output bit clock signal, the program utilizing the denominator of the fractional remainder to determine an adjustment set equal to the number of periods of the output bit clock signal over which the adjustment is to occur, and the program utilizing the numerator of the fractional remainder to determine the number of bit clock periods in the adjustment set to which a base clock period is added for the adjusting.

8. The system according to claim 7, wherein the program contained in the configuring component includes a portion for spreading the added base clock periods relatively evenly over the adjustment set.

9. A method for providing an output pulse signal which is synchronized to an input reference pulse signal and which free runs at a programmed rate in the absence of the reference pulse signal comprising:
a) providing a digital phase lock loop having an input to receive the reference pulse signal, a source of base clock signals, a configuring component operatively associated therewith and an output to provide the output pulse signal;
b) utilizing the configuring component to program the pulse width time of the output pulse signal and at least one offset time between the output pulse signal and the input reference pulse signal; and
c) causing the digital phase lock loop to provide the output pulse signal synchronized to the rising edges of the pulses of the input reference pulse signal and in the absence of a pulse of the reference signal to provide the output pulse signal free running at a programmed rate.

10. A method for providing an output pulse signal which is synchronized to an input reference pulse signal and which free runs at a programmed rate in the absence of the reference pulse signal comprising:
a) providing a digital phase lock loop having an input to receive the reference pulse signal, a source of base clock signals, a configuring component operatively associated therewith and an output to provide the output pulse signal;
b) utilizing the configuring component to provide an adjustment in the period of the output pulse signal in the event that the period is not an integral multiple of the period of the base clock signal; and
c) causing the digital phase lock loop to provide the output pulse signal synchronized to the rising edges of the pulses of the input reference pulse signal and in the absence of a pulse of the reference signal to provide the output pulse signal free running at a programmed rate.

11. The method according to claim 10, wherein the adjustment is provided by:
a) computing the number of base clock periods in the period of the output pulse signal to obtain a result in the form,of a whole number and a fractional remainder if any;
b) utilizing the whole number to specify the unadjusted number of base clock periods in each period of the output pulse signal;
c) utilizing the denominator of the fractional remainder to determine an adjustment set equal to the number of periods of the output pulse signal over which the adjustment will occur; and d) utilizing the numerator of the fractional remainder to determine the number of output pulse clock periods in the adjustment set to which a base clock period is added for the adjusting.

12. The method according to claim 11 further including spreading the added base clock periods relatively evenly over the adjustment set.

13. A method for initializing a programmable digital phase lock loop to provide an output pulse signal which is synchronized to an input reference pulse signal and which free runs at a programmed rate in the absence of the reference pulse signal comprising:
   a) providing input calling parameters for the programmable digital phase lock loop including the period of a base clock signal, the period of the output pulse signal, the percent of the period of the output pulse signal that the output pulse is high and the position in time of the rising edge of the input reference pulse signal;
   b) computing the number of ticks of the base clock of the digital phase lock loop in the period of the output pulse signal to obtain a result in the form of a whole number and a fractional remainder if any;
   c) utilizing the input calling parameters to compute the times of the offset between the rising edge of the input reference pulse signal and the rising edge of the output pulse signal, of the width of the output pulse signal and of the offset between the trailing edge of the output pulse and the next expected rising edge of the reference pulse signal;
   d) utilizing the fractional remainder when present to create an adjustment in the period of the output pulse signal to minimize drift error; and
   e) writing configuration values obtained from the foregoing initializing to the programmable digital phase lock loop.

14. The method according to claim 13, wherein the whole number in the result is the unadjusted number of ticks of the base clock in each period of the output pulse signal and wherein the adjustment in the period of the output pulse signal is created by:
   a) utilizing the denominator of the fractional remainder to determine an adjustment set equal to the number of periods of the output pulse signal over which the adjustment will occur; and
   b) utilizing the numerator of the fractional remainder to determine the number of base clock ticks in the adjustment set to which a bit clock tick is added for the adjustment.

15. The method according to claim 14, wherein the base clock ticks are spread relatively evenly over the adjustment length.

16. The method according to claim 14 wherein the output pulse signal contains successive adjustment sets each containing the same number of periods of the output pulse signal and wherein the same number of base clock ticks is added in each successive adjustment set.

17. A method of operating a programmable digital phase lock loop initialized according to the method of claim 13.

18. A method of operating a programmable digital phase lock loop initialized according to the method of claim 14.

19. The method according to claim 17, wherein operating the programmable digital phase lock loop comprises:
   a) detecting a rising edge of the input reference pulse signal;
   b) setting the output pulse low
   c) waiting a programmed offset time measured from the rising edge;
   d) generating an output pulse having a programmed pulse width;
   e) waiting a programmed offset time measured between the trailing edge of the output pulse and the rising edge of the next expected reference pulse;
   f) repeating the foregoing sequence beginning with part b) in response to detecting a rising edge of the next expected reference pulse;
   g) repeating the foregoing sequence beginning with part c) at a programmed free running rate in the absence of a rising edge of the next expected reference pulse; and
   h) interrupting the sequence at the free running rate immediately upon detecting a rising edge of the reference pulse and repeating the foregoing sequence beginning with part b) at the non-free running rate.

20. The method according to claim 18, wherein operating the programmable digital phase lock loop comprises;
   a) detecting a rising edge of the input reference pulse signal;
   b) setting the output pulse low;
   c) waiting a programmed offset time measured from the rising edge;
   d) generating an output pulse having a programmed pulse width;
   e) waiting a programmed offset time measured between the trailing edge of the output pulse and the rising edge of the next expected reference pulse;
   f) repeating the foregoing sequence beginning with part b) in response to detecting a rising edge of the next expected reference pulse;
   g) repeating the foregoing sequence beginning with part c) at a programmed free running rate in the absence of a rising edge of the next expected reference pulse; and
   h) interrupting the sequence at the free running rate immediately upon detecting a rising edge of the reference pulse and repeating the foregoing sequence beginning with part b) at the non-free running rate.

21. A computer-readable medium having computer-executable instructions for performing a method as defined in claim 13.

22. A computer readable medium having computer-executable instructions for performing a method as defined in claim 14.

23. A computer readable medium having computer-executable instructions for performing a method as defined in claim 17.

24. A computer readable medium having computer-executable instructions for performing a method as defined in claim 18.

25. In a telephony network including a telephony switch and one or more emulated digital telephony devices having operations to be commanded and monitored by said telephony switch:
   a) an analog/digital converter coupled to said telephony switch having an output to provide a pulse data signal including commands for said one or more digital telephony devices provided by said telephony switch and having an input to receive a signal including information on the state of said one or more digital telephony devices to be sent to said telephony switch;
   b) a programmable digital phase lock loop having an input to receive the pulse data signal and having an output to provide a bit clock signal synchronized to the rising edge of the pulse and which free runs at a programmed rate in the absence of the rising edge of the pulse data signal, the bit clock signal having programmed parameters including pulse width and offset from the pulse data signal;

c) a microprocessor operatively connected to said programmable digital phase lock loop;

d) a receive component having inputs to receive the pulse data signal and the bit clock signal and operatively connected to said microprocessor to convert serial data obtained from the pulse data signal into parallel data for use by said microprocessor to determine operations commanded by said telephony switch for said one or more digital telephony devices; and e) a transmit component operatively connected to said microprocessor and having an input to receive the bit clock signal and an output connected to the input of said analog/digital converter to convert parallel data obtained from said microprocessor to serial data for transmission to said telephony switch to provide information on the state of said one or more digital telephone devices.

26. The telephony network of claim 25, wherein said programmable digital phase lock loop provides the bit clock signal to provide said receive component with information on the times at which data can be extracted from the pulse data signal and to provide said transmit component with information on the rate at which data can be transmitted to said telephony switch.

* * * * *